United States Patent
Huang et al.

(10) Patent No.: US 6,528,422 B1
(45) Date of Patent: Mar. 4, 2003

(54) METHOD TO MODIFY 0.25μM 1T-RAM BY EXTRA RESIST PROTECT OXIDE (RPO) BLOCKING

(75) Inventors: Ching-Kwun Huang, Yongho (TW); Chih-Chang Chen, Hsin-Chu (TW); Hsien-Chih Peng, Hsin-Chu (TW); Pin-Shyne Chin, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/808,924

(22) Filed: Mar. 16, 2001

(51) Int. Cl.⁷ .............................................. H01L 21/44
(52) U.S. Cl. ........................ 438/683; 438/241; 438/655
(58) Field of Search .................................. 438/683, 684, 438/655, 656, 241, 669

(56) References Cited

U.S. PATENT DOCUMENTS

| | | | |
|---|---|---|---|
| 5,434,438 A | 7/1995 | Kuo | 257/300 |
| 5,863,820 A | 1/1999 | Huang | 438/241 |
| 5,918,148 A | 6/1999 | Sato | 438/669 |
| 5,998,252 A * | 12/1999 | Huang | 438/241 |
| 6,004,843 A * | 12/1999 | Huang | 438/241 |
| 6,015,730 A | 1/2000 | Wang et al. | 438/241 |
| 6,048,738 A | 4/2000 | Hsu et al. | 438/3 |
| 6,074,915 A * | 6/2000 | Chen et al. | 438/258 |
| 6,091,106 A | 7/2000 | Park | 257/330 |
| 6,093,593 A * | 7/2000 | Jang | 438/221 |
| 6,187,655 B1 * | 2/2001 | Wang et al. | 438/528 |
| 6,194,258 B1 * | 2/2001 | Wuu | 438/200 |
| 6,319,784 B1 * | 11/2001 | Yu et al. | 438/301 |
| 6,350,636 B1 * | 2/2002 | Lee et al. | 438/186 |

* cited by examiner

Primary Examiner—Olik Chaudhuri
Assistant Examiner—Fernando Toledo
(74) Attorney, Agent, or Firm—George O. Saile; Stephen B. Ackerman; Stephen G. Stanton

(57) ABSTRACT

A method to fabricate a 1T-RAM device, comprising the following steps. A semiconductor substrate having an access transistor area and an exposed bottom plate within a capacitor area proximate the access transistor area is provided. A gate with an underlying gate dielectric layer within the access transistor area are formed. The gate and underlying gate dielectric layer having sidewall spacers formed over their respective exposed side walls. A top plate with an underlying capacitor layer over the bottom plate within the capacitor area are formed. The top plate and underlying capacitor layer having sidewall spacers formed over their respective exposed side walls. A patterned resist protect oxide (RPO) layer is formed over at least the drain of the structure not to be silicided. Metal silicide portions are formed over the structure not protected by the RPO layer.

28 Claims, 3 Drawing Sheets

METHOD TO MODIFY 0.25µM 1T-RAM BY EXTRA RESIST PROTECT OXIDE (RPO) BLOCKING

FIELD OF THE INVENTION

The present invention relates generally to semiconductor memory devices and more specifically to methods to improve 1T-RAM 0.25 µm logic-based DRAM.

BACKGROUND OF THE INVENTION

1T-RAM is a logic-based DRAM that easily fails due to high junction leakage current created by the logic process. In the current process, resist protect oxide (RPO) is used where it is desired that silicidation not take place, for example ESD device or non-silicide resistor.

U.S. Pat. No. 6,015,730 to Wang et al. and U.S. Pat. No. 5,863,820 to Huang each describe salicide processes with a resist protect oxide (RPO) protective step.

U.S. Pat. No. 6,048,738 to Hsu et al. describes a process for fabricating a 1T ferroelectric random access memory (FRAM) for a VLSI RAM array.

U.S. Pat. No. 6,091,106 to Park describes an SRAM process forming a transistor structure having a grooved gate.

U.S. Pat. No. 5,918,148 to Sato describes a 1T SRAM process wherein the reduction in product quality and yield due to the partial reduction in restoring level, a lag of timing, can be avoided.

U.S. Pat. No. 5,434,438 to Kuo describes a 1T and one capacitor memory device.

SUMMARY OF THE INVENTION

Accordingly, it is an object of the present invention to provide an RPO method to reduce junction leakage of 1T-RAM logic base DRAM.

Other objects will appear hereinafter.

It has now been discovered that the above and other objects of the present invention may be accomplished in the following manner. Specifically, a semiconductor substrate having an access transistor area and an exposed bottom plate within a capacitor area proximate the access transistor area is provided. A gate with an underlying gate dielectric layer within the access transistor area are formed. The gate and underlying gate dielectric layer having sidewall spacers formed over their respective exposed side walls. A top plate with an underlying capacitor layer over the bottom plate within the capacitor area are formed. The top plate and underlying capacitor layer having sidewall spacers formed over their respective exposed side walls. A patterned resist protect oxide (RPO) layer is formed over at least the drain of the structure not to be silicided. Metal silicide portions are formed over the structure not protected by the RPO layer.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Based upon failure mode and current analysis data, the inventors believe leakage is the root cause of SRAM failure (random single bit (RSB) SRAM failure mode). Two likely leakage paths are suggested:

(1) junction leakage—salicide formation problem is suspected; by WAT mapping of edge worse with salicide formation;
DRAM cell leaky junction using logic process is suspected; and (2) leakage near STI—although this theory must be verified.

The inventors have discovered that by creating an extra resist protect oxide (RPO) block to prevent salicide formation at selected locations, leakage caused by salicide is thus suppressed.

Unless otherwise specified, all structures, layers, steps, methods, etc. may be formed or accomplished by conventional steps or methods known in the prior art.

Figure 1:
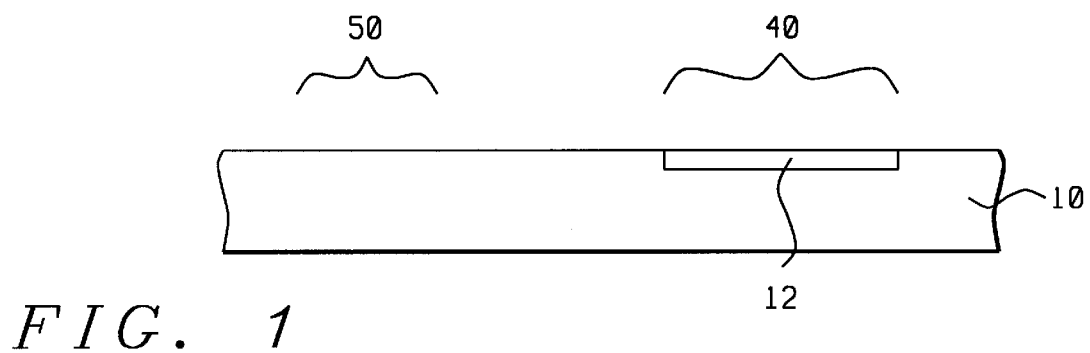
FIGS. 1 to 7 illustrate a preferred embodiment of the present invention.

As shown in FIG. 1 semiconductor substrate 10 includes an access transistor area 50, and a capacitor area 40 within which is bottom plate 12 for a capacitor. Semiconductor substrate 10 is preferably comprised of silicon. Bottom plate 12 is preferably comprised of silicon. Actually, no special layer formation is necessary for layer 12. It should only work by general device operation. That is, an inversion layer is formed when $V_g > V_T$ is applied.

Figure 2:
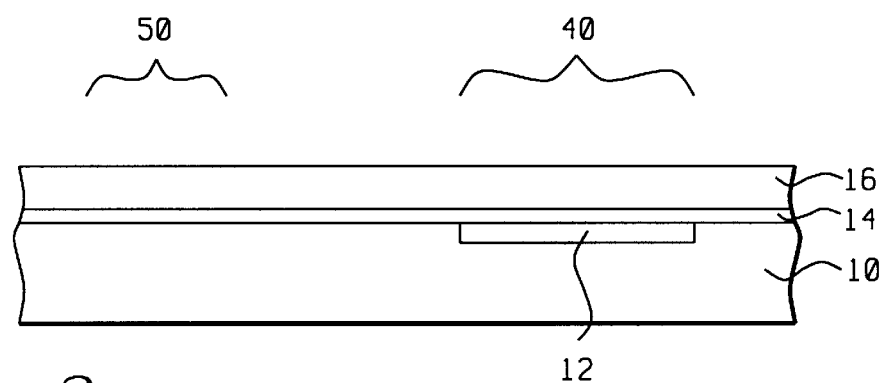

As shown in FIG. 2, dielectric layer 14 is formed over semiconductor substrate 10 and bottom plate 12 to a thickness of preferably from about 10 to 70 Å and more preferably from about 15 to 65 Å. Dielectric layer 14 is preferably comprised of silicon nitride or gate oxide and is preferably comprised of gate oxide.

Conductive layer 16 is then formed over dielectric layer 14 to a thickness of preferably from about 1000 to 3000 Å and more preferably from about 1200 to 2800 Å. Conductive layer 16 is preferably comprised of polysilicon.

Figure 3:
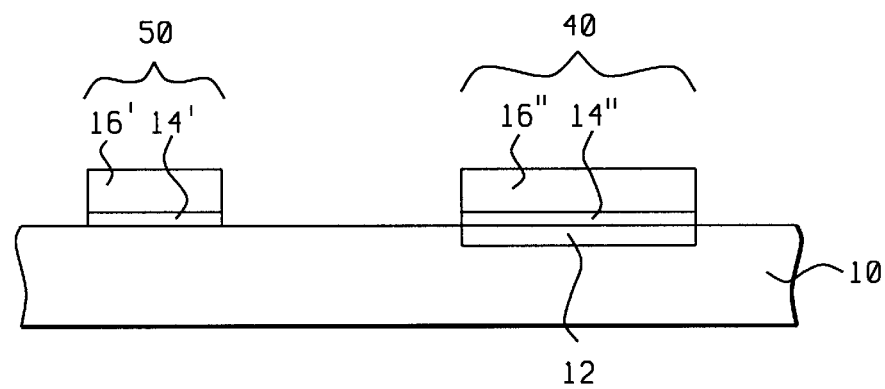

As shown in FIG. 3, conductive layer 16 and dielectric layer 14 are patterned to form, for example: gate 16' over gate dielectric layer 14' of an access transistor within access transistor area 50; and top plate 16" over capacitor layer 14" (which is in turn over bottom plate 12) of a capacitor within capacitor area 40.

Figure 4:
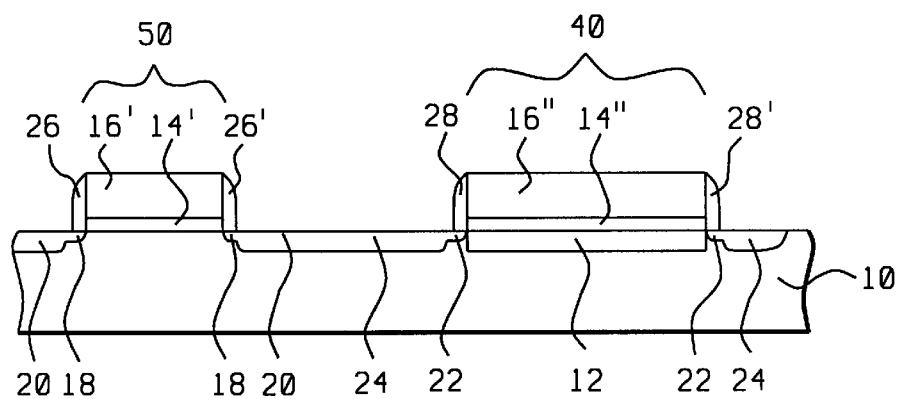

As shown in FIG. 4, access transistor LDD implants 18 are formed within semiconductor substrate 10 adjacent gate 16'/gate dielectric layer 14' and capacitor LDD implants 22 are formed within semiconductor substrate 10 adjacent top plate 16"/capacitor layer 14"/bottom plate 12. LDD implants 18 and LDD implants 22 are the same LDD implant.

Access transistor sidewall spacers 26, 26' are formed upon the exposed side walls of gate 16'/gate dielectric layer 14', and capacitor sidewall spacers 28, 28' are formed upon the exposed side walls of top plate 16"/capacitor layer 14"; Access transistor sidewall spacers 26, 26' and capacitor sidewall spacers 28, 28' are preferably from about 500 to 2000 Å wide and are more preferably from about 550 to 1950 Å wide.

Access transistor high density implants 20 are formed within semiconductor substrate 10 adjacent gate adjacent access transistor LDD implants 18 and high density implants 24 are formed within semiconductor substrate 10 adjacent capacitor LDD implants 22. High density implants 20 and high density implants 24 are the same source/drain implant. Formation of RPO Protective Portion 32

Figure 5:
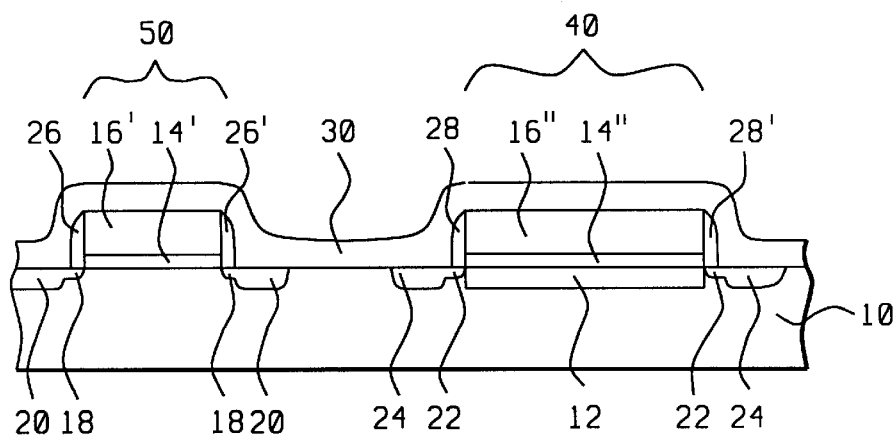

As shown in FIG. 5, RPO layer 30 is formed over the structure of FIG. 4 to a thickness of preferably from about 100 to 500 Å and more preferably from about 150 to 450 Å.

Figure 6:
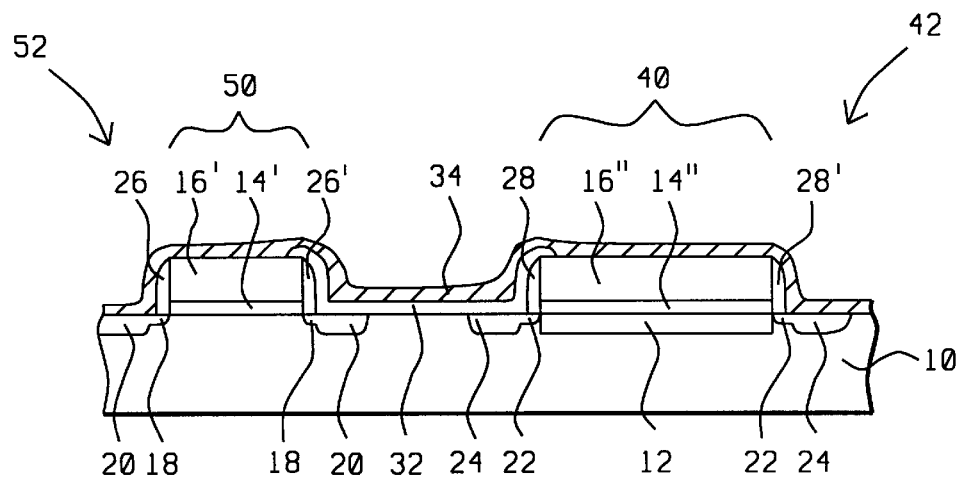

In a key step of the invention, and as shown in FIG. 6, RPO layer 30 is patterned to leave RPO protective portion 32 over semiconductor substrate 10 over at least the drain, i.e. between access transistor 52 and capacitor 42 and generally over the respective facing sidewall spacers (in this example access transistor sidewall spacer 26' and capacitor sidewall spacer 28). RPO protective portion 32 has a thickness of preferably from about 100 to 500 Å and more preferably from about 150 to 450 Å.

It is understood that RPO protective portion 32 may be also formed in another location which is to be protected from a silicide formation reaction between metal layer 34 and underlying contacted silicon/polysilicon during a subsequent rapid thermal anneal (RTA), for example. The key of the invention is to add RPO layout on MoSys 1T-SRAM, where there is no RPO blocking on original/prior art MoSys 1T-SRAM IP. RPO protective portion may be formed anywhere the design calls for, but here in 1T-SRAM it provides a leakage prevention and makes the 1T-SRAM properly work. RPO may be formed at other locations, but the key is to add RPO blocking portion 32 inside the 1T-SRAM as shown in FIG. 6.

Formation of Metal Silicide Portions 36, 38, 41, 48

As shown in FIG. 6, metal layer 34 is formed over the structure and over RPO protective portion 32 to a thickness of preferably from about 100 to 800 Å and more preferably from about 150 to 750 Å. Metal layer is preferably comprised of nickel (Ni), cobalt (Co) or titanium (Ti) and is more preferably comprised of titanium.

Figure 7:
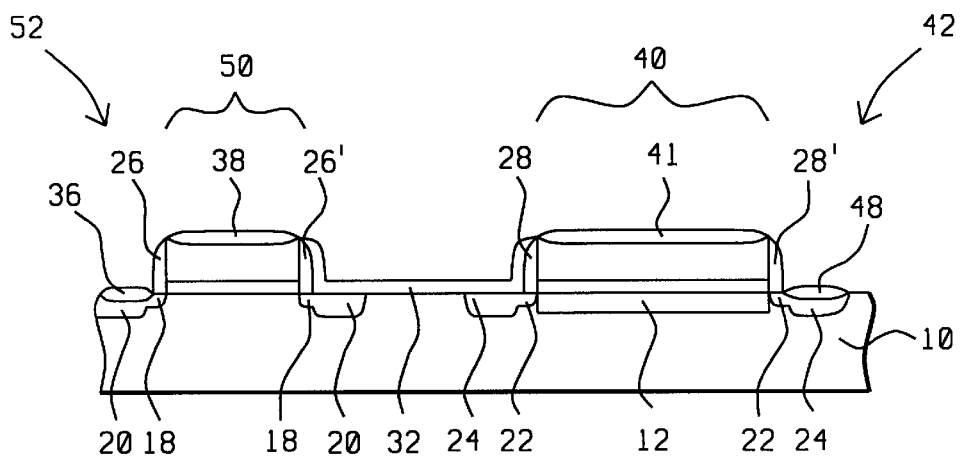

As shown in FIG. 7, a first rapid thermal anneal (RTA) process is then performed to form metal silicide portions 36, 38, 41, 42 over silicon/polysilicon other than where RPO protective portion 32 separates metal layer 34 from otherwise exposed silicon/polysilicon. Where metal layer 34 is titanium, the metal silicide portions 36, 38, 41, 42 are comprised of $TiSi_x$.

A selective etch of $TiSi_x$ is then performed leaving $TiSi_x$ portions 36, 38, 41, 48, the unreacted Ti is removed from, inter alia, over RPO portion 32 and a second PTA is performed to complete formation of access transistor 52 and capacitor 42 of a 1T-RAM logic base DRAM.

In tests conducted by the inventors, it was found that by using the method of the present invention wafer yields were increased from about 10% to up to about 86%. It is noted that different products may vary as to the wafer yield increase.

Advantages of the Present Invention

The advantages of the present invention include:
1) junction leakage is reduced in 1T-RAM logic base DRAM; and
2) yields are increased from about 10% to about 86%.

While particular embodiments of the present invention have been illustrated and described, it is not intended to limit the invention, except as defined by the following claims.

We claim:

1. A method to fabricate a 1T-RAM device, comprising the steps of:

providing a semiconductor substrate having an access transistor area and an exposed bottom plate within a capacitor area proximate the access transistor area;

forming a gate with an underlying gate dielectric layer within the access transistor area; the gate and underlying gate dielectric layer having sidewall spacers formed over their respective exposed side walls;

forming a top plate with an underlying capacitor layer over the bottom plate within the capacitor area; the top plate and underlying capacitor layer having sidewall spacers formed over their respective exposed side walls;

forming a patterned resist protect oxide (RPO) layer over at least the drain of the structure not to be silicided; wherein the patterned resist protect oxide (RPO) layer is formed at least over the semiconductor substrate between the access transistor area and the capacitor area and over the gate/gate dielectric layer sidewall spacer adjacent the capacitor area and over the top plate/capacitor layer sidewall spacer adjacent the access transistor area; and forming metal silicide portions over the structure not protected by the RPO layer; whereby metal silicide is not formed at least over the semiconductor substrate between the access transistor area and the capacitor area.

2. The method of claims 1, wherein the formation of the metal silicide portions are formed by:

forming a metal layer over the structure; and
subjecting the structure to a rapid thermal anneal (RTA).

3. The method of claim 1, wherein the formation of the metal silicide portions are formed by:

forming a metal layer over the structure;
subjecting the structure to a first rapid thermal anneal (RTA);
selectively etching the metal silicide formed; and
subjecting the structure to a second rapid thermal anneal (RTA).

4. The method of claim 1, including the steps of:

forming access transistor LDD implants adjacent the gate/gate dielectric layer and capacitor LDD implants adjacent the top plate/capacitor layer; and forming access transistor high density implants adjacent the access transistor LDD implants and capacitor high density implants adjacent the capacitor LDD implants.

5. The method of claim 1, wherein the gate and top plate each have a thickness of from about 1000 to 3000 Å; the gate dielectric layer and the capacitor layer each have a thickness of from about 10 to 70 Å; the gate/gate dielectric layer sidewall spacers are from about 500 to 2000 Å wide; and the top plate/capacitor layer sidewall spacers are from about 500 to 2000 Å wide.

6. The method of claim 1, wherein the gate and top plate each have a thickness of from about 1200 to 2800 Å; the gate dielectric layer and the capacitor layer each have a thickness of from about 15 to 65 Å; the gate/gate dielectric layer sidewall spacers are from about 550 to 1950 Å wide; and the top plate/capacitor layer sidewall spacers are from about 550 to 1950 Å wide.

7. The method of claim 1, wherein the patterned resist protect oxide (RPO) layer has a thickness of from about 100 to 500 Å; and the metal silicide portions have a thickness of from about 100 to 800 Å.

8. The method of claim 1, wherein the patterned resist protect oxide (RPO) layer has a thickness of from about 150 to 450 Å; and the metal silicide portions have a thickness of from about 150 to 750 Å.

9. The method of claim 1, wherein the gate dielectric layer and the capacitor layer are each comprised of gate oxide; the gate and the top plate are each comprised of polysilicon; and the metal silicide portions are comprised of a metal silicide selected from the group consisting of $NiSi_x$, $CoSi_x$ and $TiSi_x$.

10. The method of claim 1, wherein the gate dielectric layer and the capacitor layer are each comprised of gate oxide; the gate and the top plate are each comprised of polysilicon; and the metal silicide portions are comprised of $TiSi_x$.

11. A method to fabricate a 1T-RAM device, comprising the steps of:

providing a semiconductor substrate having an access transistor area and an exposed bottom plate within a capacitor area proximate the access transistor area;

forming a gate with an underlying gate dielectric layer within the access transistor area; the gate and underlying gate dielectric layer having sidewall spacers formed over their respective exposed side walls;

forming a top plate with an underlying capacitor layer over the bottom plate within the capacitor area; the top plate and underlying capacitor layer having sidewall spacers formed over their respective exposed side walls;

forming a patterned resist protect oxide (RPO) layer over at least the drain of the structure not to be silicided; wherein the patterned resist protect oxide (RPO) layer is formed at least over the semiconductor substrate between the access transistor area and the capacitor area and over the gate/gate dielectric layer sidewall spacer adjacent the capacitor area and over the top plate/capacitor layer sidewall spacer adjacent the access transistor area;

forming a metal layer over the structure and over RPO layer; and rapid thermal annealing the structure to form metal silicide portions over the structure not protected by the RPO layer; whereby metal silicide is not formed at least over the semiconductor substrate between the access transistor area and the capacitor area.

12. The method of claim 11, including the steps of:

forming access transistor LDD implants adjacent the gate/gate dielectric layer and capacitor LDD implants adjacent the top plate/capacitor layer; and forming access transistor high density implants adjacent the access transistor LDD implants and capacitor high density implants adjacent the capacitor LDD implants.

13. The method of claim 11, wherein the gate and top plate each have a thickness of from about 1000 to 3000 Å; the gate dielectric layer and the capacitor layer each have a thickness of from about 10 to 70 Å; the gate/gate dielectric layer sidewall spacers are from about 500 to 2000 Å wide; and the top plate /capacitor layer sidewall spacers are from about 500 to 2000 Å wide.

14. The method of claim 11, wherein the gate and top plate each have a thickness of from about 1200 to 2800 Å; the gate dielectric layer and the capacitor layer each have a thickness of from about 15 to 65 Å; the gate/gate dielectric layer sidewall spacers are from about 550 to 1950 Å wide; and the top plate/capacitor layer sidewall spacers are from about 550 to 1950 Å wide.

15. The method of claim 11, wherein the patterned resist protect oxide (RPO) layer has a thickness of from about 100 to 500 Å; and the metal silicide portions have a thickness of from about 100 to 800 Å.

16. The method of claim 11, wherein the patterned resist protect oxide (RPO) layer has a thickness of from about 150 to 450 Å; and the metal silicide portions have a thickness of from about 100 to 750 Å.

17. The method of claim 11, wherein the gate dielectric layer and the capacitor layer are each comprised of gate oxide; the gate and the top plate are each comprised of polysilicon; and the metal silicide portions are comprised of a metal silicide selected from the group consisting of $CoSi_x$, $NiSi_x$ and $TiSi_x$.

18. The method of claim 11, wherein the gate dielectric layer and the capacitor layer are each comprised of gate oxide; the gate and the top plate are each comprised of polysilicon; and the metal silicide portions are comprised of $TiSi_x$.

19. A method to fabricate a 1T-RAM device, comprising the steps of:

providing a semiconductor substrate having an access transistor area and an exposed bottom plate within a capacitor area proximate the access transistor area;

forming a gate with an underlying gate dielectric layer within the access transistor area; the gate and underlying gate dielectric layer having sidewall spacers formed over their respective exposed side walls; the gate being comprised of polysilicon; the gate dielectric layer being comprised of gate oxide;

forming a top plate with an underlying capacitor layer over the bottom plate within the capacitor area; the top plate and underlying capacitor layer having sidewall spacers formed over their respective exposed side walls; the top plate being comprised of polysilicon; the capacitor layer being comprised of gate oxide;

forming a patterned resist protect oxide (RPO) layer over at least the drain of the structure not to be silicided; wherein the patterned resist protect oxide (RPO) layer is formed at least over the semiconductor substrate between the access transistor area and the capacitor area and over the gate/gate dielectric layer sidewall spacer adjacent the capacitor area and over the top plate/capacitor layer sidewall spacer adjacent the access transistor area; and forming metal silicide portions over the structure not protected by the RPO layer; whereby metal silicide is not formed at least over the semiconductor substrate between the access transistor area and the capacitor area.

20. The method of claim 19, wherein the formation of the metal silicide portions are formed by:

forming a metal layer over the structure; and subjecting the structure to a rapid thermal anneal (RTA).

21. The method of claim 19, wherein the formation of the metal silicide portions are formed by:

forming a metal layer over the structure;

subjecting the structure to a first rapid thermal anneal (RTA);

selectively etching the metal silicide formed; and subjecting the structure to a second rapid thermal anneal (RTA).

22. The method of claim 19, including the steps of:

forming access transistor LDD implants adjacent the gate/gate dielectric layer and capacitor LDD implants adjacent the top plate/capacitor layer; and forming access transistor high density implants adjacent the access transistor LDD implants and capacitor high density implants adjacent the capacitor LDD implants.

23. The method of claim 19, wherein the gate and top plate each have a thickness of from about 1000 to 3000 Å; the gate dielectric layer and the capacitor layer each have a thickness of from about 10 to 70 Å; the gate/gate dielectric layer sidewall spacers are from about 500 to 2000 Å wide; and the top plate/capacitor layer sidewall spacers are from about 500 to 2000 Å wide.

24. The method of claim 19, wherein the gate and top plate each have a thickness of from about 1200 to 2800 Å; the gate dielectric layer and the capacitor layer each have a thickness of from about 15 to 65 Å; the gate/gate dielectric layer sidewall spacers are from about 550 to 1950 Å wide; and the top plate/capacitor layer sidewall spacers are from about 550 to 1950 Å wide.

25. The method of claim 19, wherein the patterned resist protect oxide (RPO) layer has a thickness of from about 100 to 500 Å; and the metal silicide portions have a thickness of from about 100 to 800 Å.

26. The method of claim 19, wherein the patterned resist protect oxide (RPO) layer has a thickness of from about 150 to 450 Å; and the metal silicide portions have a thickness of from about 150 to 750 Å.

27. The method of claim 19, wherein the metal silicide portions are comprised of a metal silicide selected from the group consisting of $NiSi_x$, and $CoSi_x$ and $TiSi_x$.

28. The method of claim 19, wherein the metal silicide portions are comprised of $TiSi_x$.

* * * * *